(12) United States Patent
Shimizu et al.

(10) Patent No.: US 10,993,361 B2
(45) Date of Patent: Apr. 27, 2021

(54) SETUP SUPPORT DEVICE (71) Applicant: FUJI CORPORATION, Chiryu (JP)

(72) Inventors: Koji Shimizu, Kota-machi (JP); Hideki Hayashi, Okazaki (JP)

(73) Assignee: FUJI CORPORATION, Chiryu (JP)

(*) Notice: Subject to any disclaimer, the term of this patent is extended or adjusted under 35 U.S.C. 154(b) by 26 days.

(21) Appl. No.: 16/348,350

(22) PCT Filed: Nov. 17, 2016

(86) PCT No.: PCT/JP2016/084159
§ 371 (c)(1),
(2) Date: May 8, 2019

(87) PCT Pub. No.: WO2018/092250
PCT Pub. Date: May 24, 2018

(65) Prior Publication Data
US 2020/0060053 A1 Feb. 20, 2020

(51) Int. Cl.
*H05K 13/08* (2006.01)
*G05B 19/418* (2006.01)

(52) U.S. Cl.
CPC ..... *H05K 13/0857* (2018.08); *G05B 19/41865* (2013.01); *H05K 13/086* (2018.08);
(Continued)

(58) Field of Classification Search
CPC .... G05B 19/41865; G05B 2219/36195; G05B 2219/45026; H05K 13/085; H05K 13/0857; H05K 13/086; H05K 13/0882
See application file for complete search history.

(56) References Cited

U.S. PATENT DOCUMENTS

| 2003/0149608 A1* | 8/2003 | Kall | G06Q 10/063 705/7.27 |
| 2004/0130863 A1* | 7/2004 | Shimizu | H05K 13/085 361/679.01 |

(Continued)

FOREIGN PATENT DOCUMENTS

| JP | 2000-59090 A | 2/2000 |
| JP | 2012-4431 A | 1/2012 |

(Continued)

OTHER PUBLICATIONS

International Search Report dated Feb. 21, 2017 in PCT/JP2016/084159 filed Nov. 17, 2016.

(Continued)

*Primary Examiner* — Chad G Erdman
(74) *Attorney, Agent, or Firm* — Oblon, McClelland, Maier & Neustadt, L.L.P.

(57) ABSTRACT

A setup support device capable of editing a setup list in accordance with a change in a production schedule or the like, thereby enabling more efficient setup of a component mounter. The setup support device includes a list editing section for performing editing to increase or decrease production jobs included in a setup list in accordance with a request from an operator who performs setup at the component mounter or a change in a production schedule, and a guidance section for issuing setup guidance for the production jobs to the operator based on the edited setup list.

8 Claims, 8 Drawing Sheets

(52) U.S. Cl.
CPC ............... *H05K 13/0882* (2018.08); *G05B 2219/36195* (2013.01); *G05B 2219/45026* (2013.01)

(56) References Cited

U.S. PATENT DOCUMENTS

| | | | |
|---|---|---|---|
| 2004/0199281 A1* | 10/2004 | Yamate | H01L 21/67236 |
| | | | 700/121 |
| 2015/0223374 A1* | 8/2015 | Nozawa | H05K 3/301 |
| | | | 29/739 |
| 2016/0231727 A1 | 8/2016 | Sagara | |
| 2019/0056701 A1* | 2/2019 | Ikeda | G06Q 10/063 |

FOREIGN PATENT DOCUMENTS

| | | | | |
|---|---|---|---|---|
| JP | 2012-94663 A | | 5/2012 | |
| JP | 2012-134565 A | | 7/2012 | |
| JP | 2016-146381 A | | 8/2016 | |
| JP | 2017-28196 A | | 2/2017 | |
| JP | 2017028196 A | * | 2/2017 | ............ H05K 13/02 |
| WO | WO2016/139793 A1 | | 9/2016 | |

OTHER PUBLICATIONS

Office Action dated Nov. 4, 2020 in corresponding Japanese Patent Application No. 2018-550947, 3 pages.

\* cited by examiner

Table 1 Production plan

| Product type | Target production quantity |
|---|---|
| U1 | T1 |
| U2 | T2 |
| U3 | T3 |
| U4 | T4 |
| ⋮ | ⋮ |

Table 2 Product data

| | Product type | | | | |
|---|---|---|---|---|---|
| | U1 | U2 | U3 | U4 | ·· |
| Component type | Component quantity | Component quantity | Component quantity | Component quantity | ·· |
| Pa | 3 | 3 | 3 | 0 | ·· |
| Pb | 4 | 4 | 4 | 2 | ·· |
| Pc | 0 | 1 | 1 | 5 | ·· |
| Pd | 2 | 2 | 0 | 3 | ·· |
| ⋮ | ⋮ | ⋮ | ⋮ | ⋮ | ⋮ |

Table 3 Production schedule

| Setup/group | Product type | Production job | Specified time | Planned start date and time | Start condition |
|---|---|---|---|---|---|
| ▼ Set1 | – | – | – | – | – |
| Gr01 | U1 | JobA | R1 | M/D1, h1 : m1 | Set1 |
| Gr01 | U2 | JobB | R2 | M/D1, h2 : m2 | Set1 |
| Gr01 | U3 | JobC | R3 | M/D1, h3 : m3 | Set1 |
| ▼ Set2 | – | – | – | – | – |
| Gr02 | U4 | JobD | R4 | M/D1, h4 : m4 | Set2 |
| Gr02 | U5 | JobE | R5 | M/D1, h5 : m2 | Set2 |
| ▼ Set3 | – | – | – | – | – |
| – | U6 | JobF | R6 | M/D1, h6 : m6 | Set3 |
| ▼ Set4 | – | – | – | – | – |
| Gr03 | U7 | JobG | R7 | M/D2, h7 : m7 | Set4 |
| Gr03 | ⋮ | ⋮ | ⋮ | ⋮ | ⋮ |

Table 4 Setup list (Ls1)

| Setup | Corresponding production jobs |
|---|---|
| Set1 | JobA – JobC |
| Set2 | JobD, JobE |

Table 5 Setup list (Ls2)

| Setup | Corresponding production jobs |
|---|---|
| Set1 | JobA – JobC |
| Set2 | JobD, JobE |
| Set3 | JobF |

FIG. 5

Setup list Ls1

Table 1  Setup guidance

| Setup | Slot | Feeder | Start condition |
|---|---|---|---|
| Set1 | SL01 | Fdx10 | ● |
| | SL02 | Fdx11 | ● |
| | : | : | : |
| | SL11 | Fdx20 | ● |
| | : | : | : |
| | SL21 | Fdx30 | ● |
| | : | : | : |
| Set2 | SL31 | Fdx40 | — |
| | SL32 | Fdx41 | — |
| | : | : | : |

Table 2  Collection guidance

| Slot | Feeder |
|---|---|
| SL07 | Fdx17 |
| SL08 | Fdx18 |
| SL15 | Fdx51 |
| SL16 | Fdx52 |
| : | : |

Table 3  Setup guidance after editing start conditions

| Setup | | Slot | Feeder | Start condition |
|---|---|---|---|---|
| Set1 | Set1-1 | SL01 | Fdx10 | ● |
| | | SL02 | Fdx11 | ● |
| | | : | : | : |
| | Set1-2 | SL11 | Fdx20 | — |
| | | : | : | : |
| | Set1-3 | SL21 | Fdx30 | — |
| | | : | : | : |
| Set2 | | SL31 | Fdx40 | — |
| | | SL32 | Fdx41 | — |
| | | : | : | : |

FIG. 6

Setup list Ls2

Table 1  Setup guidance

| Setup | Slot | Feeder | Start condition |
|---|---|---|---|
| Set1 | SL01 | Fdx10 | ● |
|  | SL02 | Fdx11 | ● |
|  | ⋮ | ⋮ | ⋮ |
| Set2 | SL31 | Fdx40 | — |
|  | SL32 | Fdx41 | — |
|  | ⋮ | ⋮ | ⋮ |
| Set3 | SL41 | Fdx60 | — |
|  | SL42 | Fdx61 | — |
|  | ⋮ | ⋮ | ⋮ |

FIG. 7

Table 1  Feeder data

| Feeder | Reel | Product type |
|---|---|---|
| Fdx10 | R-01 | Pa |
| Fdx11 | R-02 | Pb |
| Fdx12 | R-03 | Pc |
| Fdx13 | R-04 | Pd |
| ⋮ | ⋮ | ⋮ |

Table 2  Loading data

| Slot | Feeder | Reel | Product type |
|---|---|---|---|
| P-SL01 | Fdx10 | R-01 | Pa |
| P-SL02 | Fdx11 | R-02 | Pb |
| P-SL31 | Fdx12 | R-03 | Pc |
| P-SL32 | Fdx13 | R-04 | Pd |
| ⋮ | ⋮ | ⋮ | ⋮ |

Required number of feeders per production job

| Group | Production job | Required number of feeders |
|---|---|---|
| Gr01 | JobA | Ev1 |
|  | JobB | Ev2 |
|  | JobC | Ev3 |
| Gr02 | JobD | Ev4 |
|  | JobE | Ev5 |
| — | JobF | Ev6 |
| Gr03 | JobG | Ev7 |
|  | ⋮ | ⋮ |

FIG. 10

SETUP SUPPORT DEVICE

TECHNICAL FIELD

The present application relates to a setup support device.

BACKGROUND ART

A setup support device supports setup of a component mounter that performs various multiple production jobs for mounting electronic components on a circuit board to produce multiple types of board products. A component mounter is provided with a component supply device that supplies various electronic components using multiple feeders. In setup of the component mounter, when the setup target is the feeders described above, it is required to set a feeder capable of supplying a component type set in advance by an optimization process or the like to each of the multiple slots on the component supply device.

Further, the contents and the timing of performance of the setup are set in advance as a setup list by optimization processing or the like in the same manner as described above, such that the efficiency of work is improved (see patent literature 1). For example, an operator performs setup according to the production schedule by checking the setup list printed out or displayed on display device as shown in patent literature 2.

CITATION LIST

Patent Literature

Patent literature 1: JP-A-2000-059090
Patent literature 2: JP-A-2012-004431

BRIEF SUMMARY

Technical Problem

However, there are cases in which the production schedule is changed, for example, if the production of a board product which was not planned to be produced becomes necessary, or if the production of a specific board product which was scheduled to be produced is canceled. In such a case, in order to inform the operator of the setup, it is necessary to generate the setup list again in accordance with the change in the content and timing of performance of the setup, so there is a worry that the production time will be increased.

In addition, depending on production conditions such as that the starting time of the production job to be performed next is approaching, the operation rate of the component mounter may be lowered if all scheduled setups are completed. Further, depending on the work state of the operator, it may be more efficient to also perform a subsequent setup for which guidance has not yet been issued together with a setup for which guidance has been issued.

The present disclosure takes account of the above circumstances, and an object of thereof is to provide a setup support device capable of editing a setup list in accordance with a change in a production schedule or the like, thereby enabling more efficient setup of a component mounter.

Solution to Problem

The setup support device disclosed in this specification is applied to a component mounter that performs various production jobs for mounting electronic components on a circuit board to produce multiple types of board products. The setup support device includes: a memory section configured to store a production schedule indicating an execution order of the production jobs as a production order of multiple types of the board products and a setup list indicating one or multiple of the production jobs selected as a setup target for enabling production of the production jobs by the component mounter among the multiple production jobs included in the production schedule; a list editing section configured to edit the setup with respect to the component mounter so as to increase or decrease the production jobs included in the setup list in response to a request from an operator who performs the setup or a change in the production schedule; and a guidance section configured to guide the operator to perform the setup of the production jobs based on the edited setup list.

Advantageous Effects

The setup support device edits a setup list in response to a request from an operator. As a result, the setup support device can vary the content of the setup in accordance with the production state and the work state recognized by the operator. In addition, the setup support device edits the setup in accordance with a change in the production schedule. As a result, the content of the setup can be changed by reflecting the production schedule changed at the production management side, and unnecessary setup can be prevented. By editing the setup list as described above, the efficiency of the setup can be improved. Further, for example, a setup unnecessary for the next production job can be postponed, and a setup that should be performed can be prioritized, thereby making effective use of human resources such as operators. In addition, when there is a change in the production schedule, it is possible to cope with the change without generating the setup list again. Therefore, it is possible to prevent the production time from increasing and to prevent the operating rate of the component mounter from decreasing.

DESCRIPTION OF EMBODIMENTS

Embodiments of a setup support device are described below with reference to the drawings. A setup support device supports setup such that a specified production job can be performed by a component mounter. A component mounter is a device that picks up electronic components using a holding member such as a suction nozzle or a chuck device and transfers the electronic components to specific coordinates on a circuit board. Multiple component mounters are, for example, arranged in a line along a conveyance direction of a circuit board to configure a production line that produces a board product.

EMBODIMENTS

Configuration of Production Line

In a production line, multiple component mounters 1 are lined up in a conveyance direction (the left-right direction in FIG. 1) of circuit board 90. The production line includes, for example, a screen printer, a mounting inspection machine, a reflow oven, and the like. The multiple component mounters 1 are connected to host computer 60 and setup support device 70 via a network such that communication is possible.

Configuration of Component Mounter 1

Figure 1:
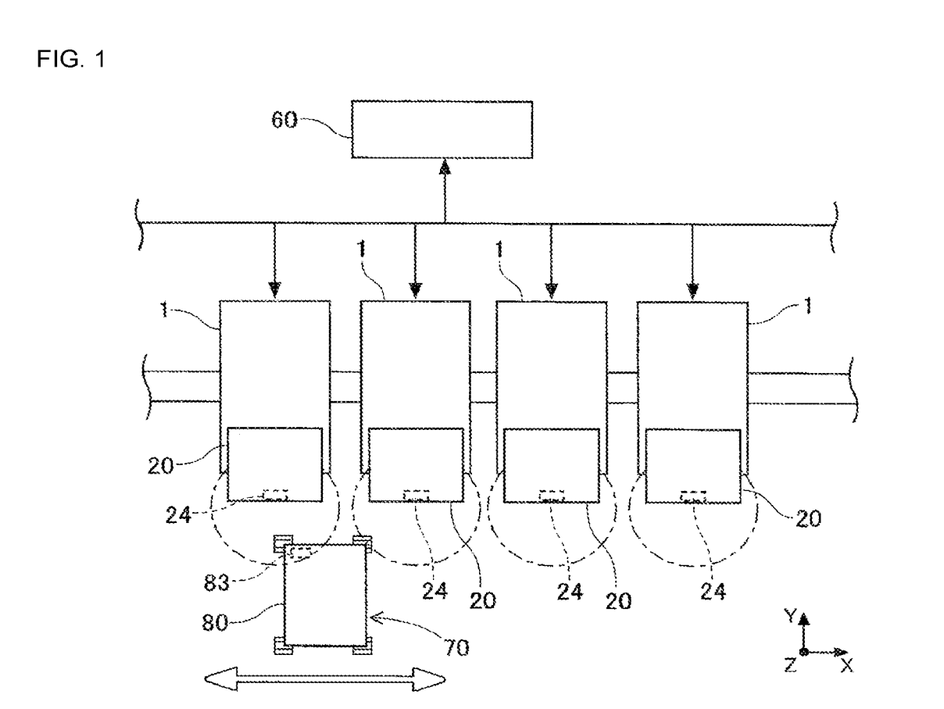
FIG. 1 is a schematic drawing showing the configuration of a production line to which a setup support device of an embodiment is applied.
Figure 2:
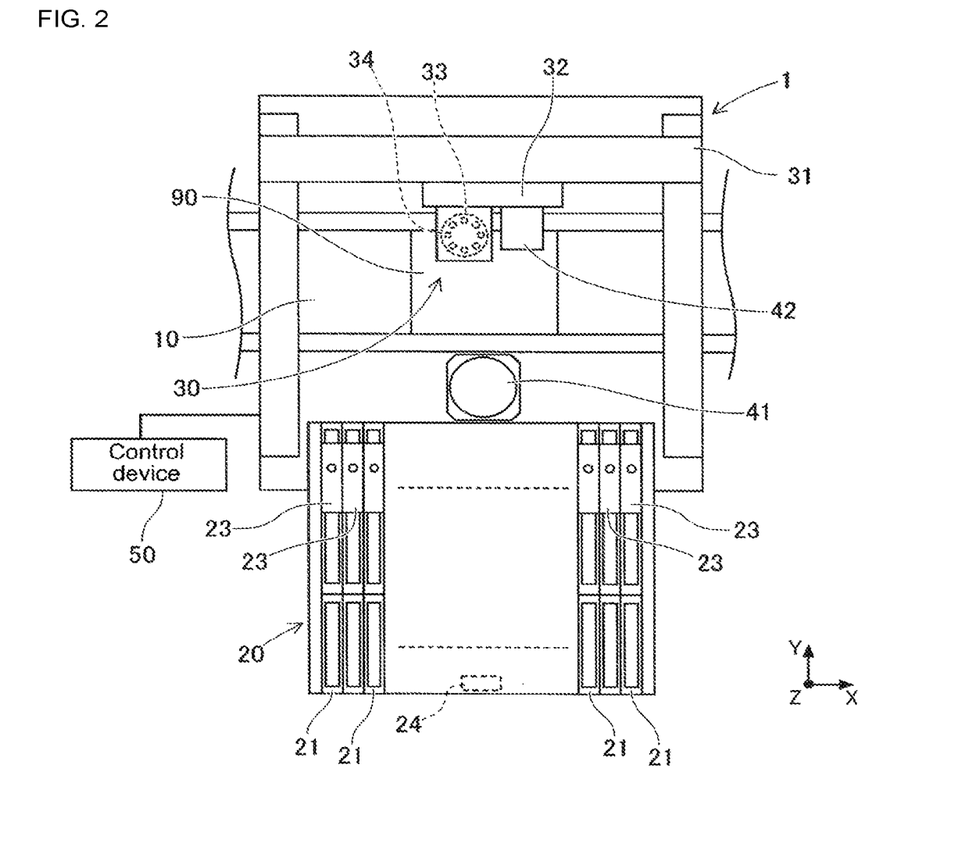
FIG. 2 is a schematic drawing showing a component mounter.

As shown in FIG. 2, component mounter 1 is provided with board conveyance device 10, component supply device 20, component transfer device 30, component camera 41, board camera 42, and control device 50. In the descriptions below, the horizontal width direction of component mounter 1 (left-right direction in FIGS. 1 and 2) is the X-axis direction, the horizontal depth direction of component mounter 1 (up-down direction in FIGS. 1 and 2) is the Y-axis direction, and the direction perpendicular to the X axis and Y axis (perpendicular to the page in FIGS. 1 and 2) is the Z-axis direction.

Board conveyance device 10 is configured from a belt conveyor or the like and consecutively conveys circuit boards 90 in a conveyance direction (in the present embodiment, the X-axis direction). Board conveyance device 10 positions circuit board 90 at a specified position inside component mounter 1. Then, after mounting processing has been performed by component mounter 1, board conveyance device 10 unloads circuit board 90 from component mounter 10.

Component supply device 20 is provided at the front side (lower side in FIG. 2) of component mounter 1. Component supply device 20 supplies electronic components to be mounted on circuit board 90. Component supply device 20 includes multiple slots 21 arranged lined up in the X-axis direction. Feeders 23 are exchangeably set in the multiple slots 21 during setup of a production job before the production job is executed. A reel around which is wound carrier tape storing many electronic components is exchangeably loaded on each feeder 23. Feeders 23 feed the carrier tape to supply electronic components to a supply position at the end of the feeder 23 such that the electronic components can be picked up.

Further, component supply device 20 20 is provided with an identification code. An identification symbol (ID) representing unique identification information of component supply device 20 is recorded on the identification code. A barcode, 2D code, or the like may be used as an identification code. In the present embodiment, the identification code is recorded on tag 24 that performs wireless communication with preparation cart 80, which is described later, and the identification code is sent to preparation cart 80 via wireless communication. Tag 24 is provided on the front of component supply device 20 at a specified height from the floor surface on which component mounter 1 is set.

Component transfer device 30 is configured to move in the X-axis direction and the Y-axis direction. Component transfer device 30 is provided with head driving device 31, moving body 32, and mounting head 33. Head driving device 31 is configured to move moving body 32 in the XY-axis directions using a linear motion mechanism. Mounting head 33 is used to perform the work of picking up an electronic component supplied by component supply device 20 and mounting the electronic component on circuit board 90. Mounting head 33 is fixed to moving body 32 by a clamp that is not shown.

Further, mounting head 33 includes multiple suction nozzles 34 that are detachable. Mounting head 33 supports each suction nozzle 34 so as to be rotatable around an R axis parallel to the Z axis and able to be raised and lowered. The height position and angle of each suction nozzle 34 with respect to mounting head 33 and the state of supply of negative pressure to each suction nozzle 34 is controlled. Negative pressure is supplied to suction nozzle 34 such that suction nozzle 34 can pick up an electronic component supplied by feeder 23 of component supply device 20. During setup of a production job, mounting head 33 and suction nozzle 34 described above are exchanged or loaded on a dedicated loading stand to be automatically exchanged in accordance with the production job.

Component camera 41 and board camera 42 are digital cameras with an imaging element such as a charge coupled device (CCD) or a complementary metal oxide semiconductor (CMOS). Component camera 41 and board camera 42 each perform imaging of a visual field range based on a control signal from control device 50 that is communicatively connected to component camera 41 and board camera 42, and transmit image data acquired from the imaging operation to control device 50.

Component camera 41 is fixed to the base of component mounter 1 such that the optical axis is aligned in the vertical direction (Z-axis direction). Component camera 41 is configured to image an electronic component held by suction nozzle 34 of mounting head 33 from below component transfer device 30. Board camera 42 is fixed to moving body 32 of component transfer device 30 such that the light axis faces down in a vertical direction (the Z-axis direction). Board camera 42 is configured to image circuit board 90. Further, in the present embodiment, board camera 42 is configured to be used for reading an identification code provided on suction nozzle 34 and mounting head 33 loaded on the above loading stand.

Control device 50 is configured mainly from a CPU, various types of memory, and control circuits. Control device 50 controls production jobs including mounting processing of mounting electronic components on circuit board 90. The above mounting processing is performed based on a control program, and is processing of repeatedly performing a pick and place cycle of picking up an electronic component supplied by component supply device 20 and mounting the electronic component at a specified position on circuit board 90. The product type, which is the type of the board product being produced by performing the production job, depends on the type of the production job being performed.

Further, control device 50 controls operation related to the position of mounting head 33 and the pickup and mounting mechanism. In detail, control device 50, in mounting processing, receives information outputted from various sensors provided on component mounter 1 and results of recognition processing by image processing and the like. Further, mounting control section 51 sends control signals to component transfer device 30 based on the information from the various sensors and the results of various recognition processing. Accordingly, the position and rotation angle of suction nozzle 34 attached to mounting head 33 is controlled.

Host Computer 60 and Various Data

Host computer 60 monitors the operating state of the production line and performs control of devices that configure the production line including the multiple component mounters 1. Also, host computer 60 collects information of the degree of progress or the like of production by component mounters 1. Various types of data used in controlling the multiple component mounters 1 that configure the production line are memorized on host computer 60. Further, host computer 60 generates a production schedule and setup list used to control setup support device 70, which is described later.

Figure 4:
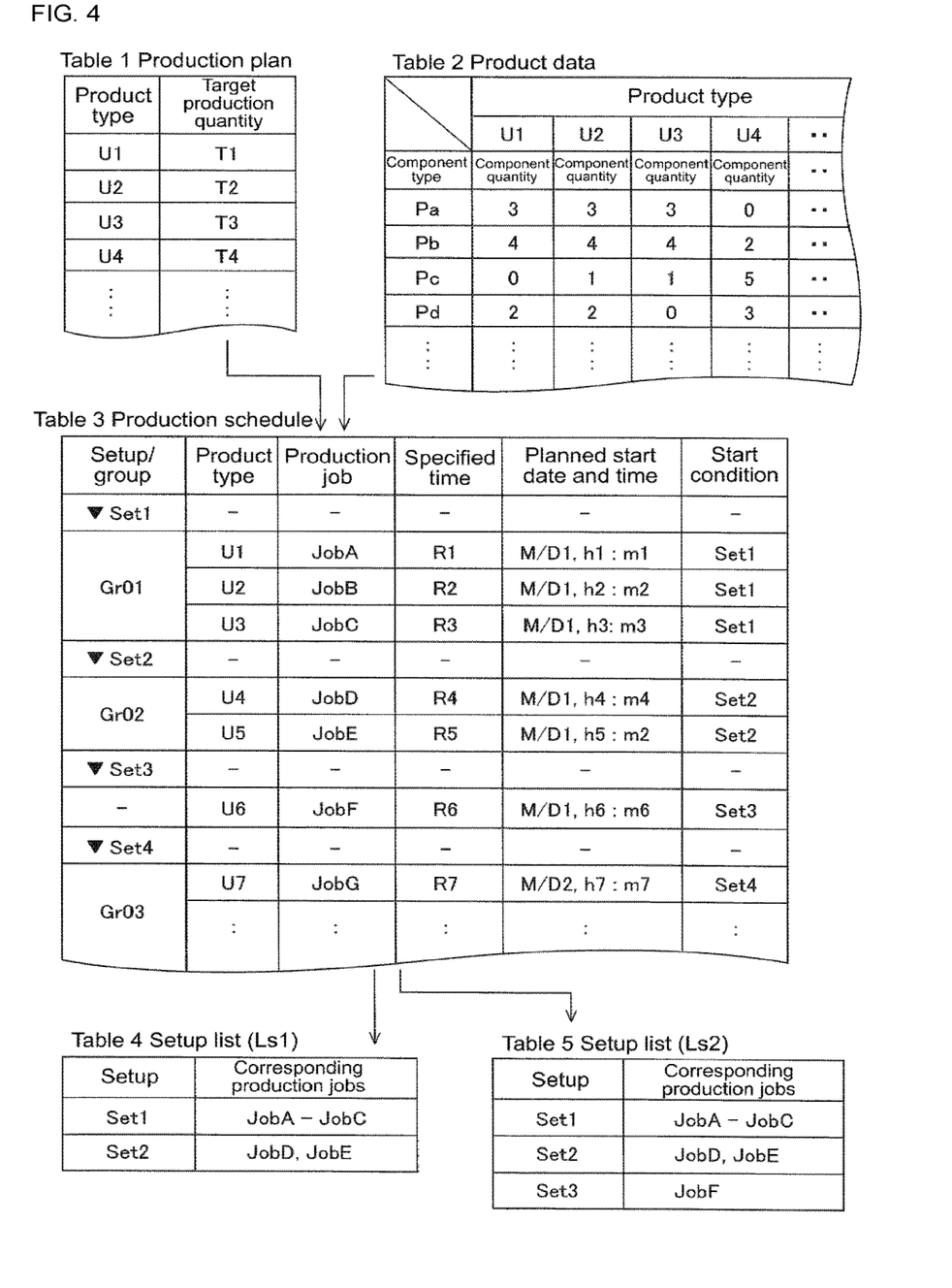
FIG. 4 shows types of data included in a setup list.

As shown in table 3 of FIG. 4, the production schedule represents the order in which production jobs (job A, job B, job C, etc.) are performed as a production order of multiple types of board products. The production schedule is generated based on the production plan (refer to table 1 of FIG. 4) and product data (refer to table 2 of FIG. 4). In the present embodiment, the order in which the multiple production jobs (job A, job B, job C, etc.) representing the production schedule are performed is set in advance by optimization processing that optimizes such the quantity of setups with respect to the multiple types of production jobs is reduced.

The above optimization processing, in a case in which, for example, a portion of the component types of the electronic components required between different product types, sets the order such that the multiple types of production jobs corresponding to these product types are performed consecutively. Accordingly, for feeders supplying common component types, setup is not required between production jobs. Further, if the total quantity of components types of the electronic components required between different product types is equal to or fewer than the quantity of slots 21 of component supply device 20, the quantity of setups can be reduced by setting feeders 23 that can supply different component types on each slot 21.

Specifically, multiple types of production jobs (job A, job B, job C, . . . ) corresponding to multiple product types (U1, U2, U3) are grouped together (Gr01). Thus, for that group (Gr01), the multiple production jobs (jobs A to C belonging to Gr01) can be performed with one setup (Set1). Further, the order in which the production jobs are performed is optimized based on factors such as the priority of production of each product type. Therefore, there are cases in which setup (Set3, Set4) is performed before or after a production job (job F) that was not grouped as above.

In the above production plan, as shown in table 1 of FIG. 4, a target production quantity (T1, T2, T3, . . . ) for each product type (U1, U2, U3, . . . ) of the board product is given. As shown in table 2 of FIG. 4, product data is data that records the component type of the electronic components required for production of a board product (Pa, Pb, Pc, Pd, . . . ), and the component quantity for each product type (U1, U2, U3, . . . ). In other words, the product data represents the component quantity consumed for each component type when producing one board product of a specified product type.

As shown in table 4 of FIG. 4, the setup lists represent one or multiple production jobs selected as targets for setup at component mounter 1 among the multiple production jobs (job A, job B, job C, . . . ) included in the production schedule. The setup list, for example, in a case in which multiple jobs (job A to job E) are selected as targets for setup, or in a case in which groups (Gr01, Gr02) corresponding to these multiple jobs (job A to job E) are selected as targets for setup, shows the required setups (Set1, Set2) corresponding to the multiple production jobs (job A to job E).

Setup Support Device 70

Figure 3:
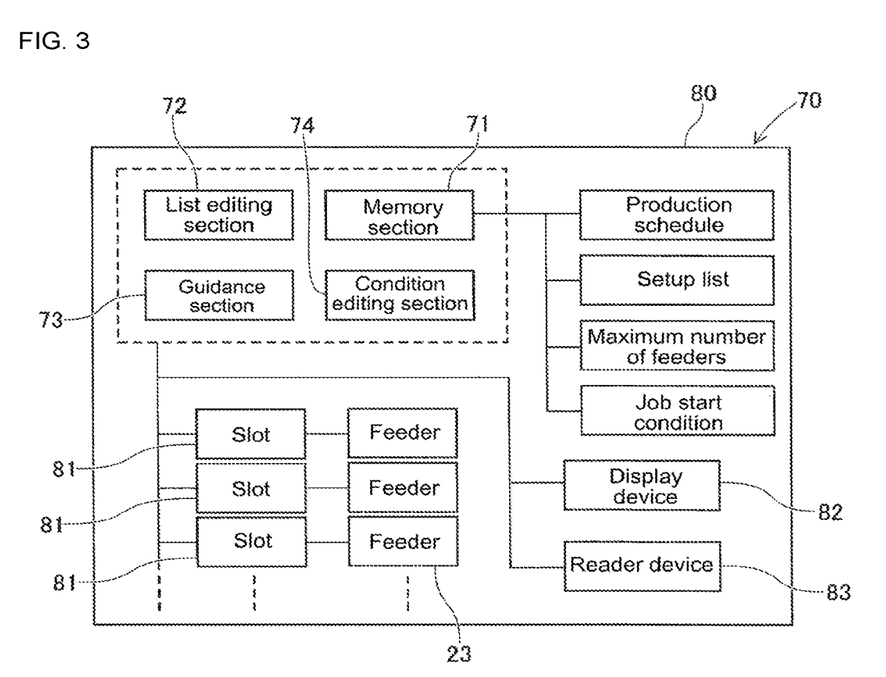
FIG. 3 is a block diagram showing the configuration of a setup support device.

Setup support device 70 is used for component mounter 1 that produces multiple types of board products (U1, U2, U3, . . . ) by executing various production jobs (job A, job B, job C, . . . ) for mounting electronic components on circuit boards 90. Setup support device 70 is connected to the multiple component mounters 1 that configure the production line and host computer 60 such that communication is possible. As shown in FIG. 3, setup support device 70 includes memory section 71, list editing section 72, guidance section 73, condition editing section 74, and preparation cart 80.

In the present embodiment, memory section 71, list editing section 72, guidance section 73, and condition editing section 74 are incorporated in a control device provided in preparation cart 80. Memory section 71 is configured from an optical drive device such as a hard disk device, flash memory, or the like. Memory section 71 memorizes various pieces of data for controlling guidance and the like of setup by setup support device 70. Memory section 71 memorizes the production schedule (table 3 of FIG. 4), and the setup list (table 4 of FIG. 4) generated by and sent from host computer 60.

List editing section 72 performs editing so as to increase or decrease the number of production jobs included in the setup list (refer to table 4 in FIG. 4) in response to a request from an operator who performs setup with respect to the component mounter 1 or to a change in the production schedule (refer to table 3 in FIG. 4). List editing section 72 receives a change to the setup list by the operator via an input device, which is not shown. A request from an operator may include, for example, a request to add a production job that is present in the production schedule and that is not in the current setup list, or a request to delete a portion of the production jobs that are included in the setup list.

Various other types of operator request may be considered. List editing section 72 may display the current setup list and production schedule, and directly receive instructions that specify each production job (job A, job B, job C, . . . ), group (Gr01, Gr02, . . . ), and setup (Set1, Set2, Set3, . . . ), and accept them as addition and delete requests.

In addition, list editing section 72 may edit the setup list in response to a request from an operator when one or multiple production jobs that can be started by a specified time out of the multiple production jobs included in the production schedule (refer to table 3 of FIG. 4) are requested to be targets for setup. Specifically, as shown in table 3 of FIG. 4, list editing section 72 determines which production job is to be a target for setup based on the scheduled start date and time calculated based on the required time (R1, R2, R3, . . . ) for each production job included in the production schedule and an entered designated time. List editing section 72 edits the setup list so that one or multiple of the production jobs thus determined are targets for setup.

Further, with respect to a request from the operator as described above, certain restrictions may occur, and the editing of the setup list may not be permitted. Here, for example, when the setup is a feeder 23 replenishment process, the above-mentioned "certain restrictions" may include a restriction based on a situation in which all the requested setups cannot be completed due to, for example, a shortage of the number of the multiple feeders 23 that can be exchanged with respect to the number of component types used for all the requested production jobs. Therefore, in the present embodiment, setup support device 70 edits the setup list within a range permitted by the certain restrictions with respect to a request from the operator.

Specifically, when there is a request by an operator to add one or more production jobs to the setup target, list editing section 72 determines whether to edit the setup list in accordance with the request from the operator based on the number of feeders 23 required for setup of the multiple production jobs after the additions and the number of usable feeders 23 at the time of the setup guidance. Setup support device 70, if the setup list can be edited according to the request, performs editing by adding the one or more production jobs to the setup list as requested.

Figure 9:
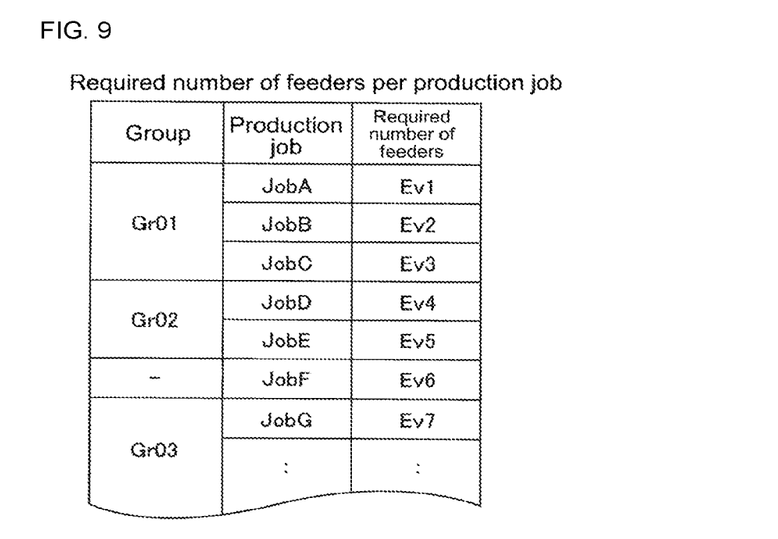
FIG. 9 shows the number of feeders required for each production job.

Here, the "number of feeders 23 required" is the number of feeders 23 required for setup of all the production jobs that are targets for setup, and increases as production jobs are added as targets for setup. For example, as shown in FIG. 9, when three production jobs (job A, job B, job C) are targets for setup, the number of feeders 23 required is a number (Ev3) obtained by adding the number required for each production job. When three production jobs (job D, job E, job F) are added as targets for setup, the number of feeders 23 required is the number (Ev6) obtained by adding each required number.

Figure 10:
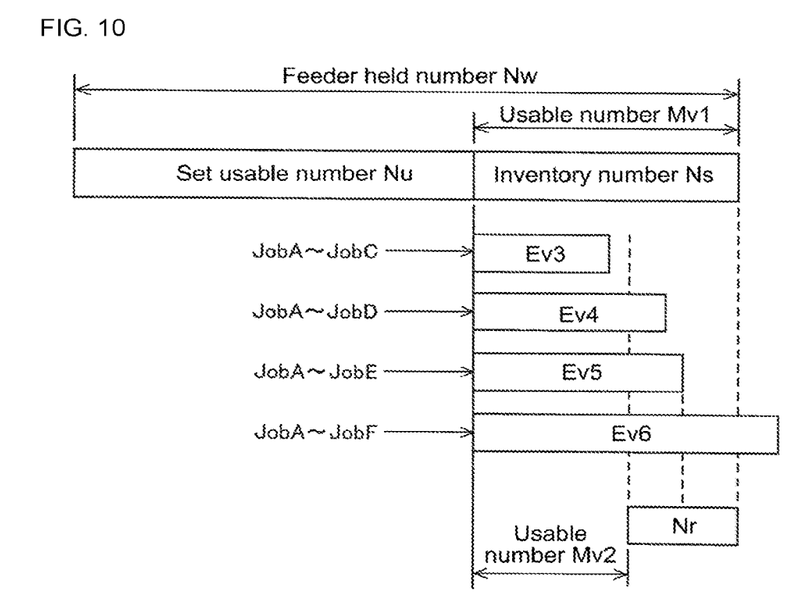
FIG. 10 shows the relationship between the number of feeders required and the number of feeders available.

Further, the above-mentioned "at the time of setup guidance" is the time when guidance is issued to the operator to perform setup of the production jobs based on the setup list. Therefore, if setup guidance is being issued, this is at the time of setup guidance, and, for example, if the setup guidance is scheduled to be issued after the end of the production job being performed, the scheduled guidance time is the time of setup guidance. Further, the "usable number of feeders 23" is the number of feeders 23 which are allowed to be set in component supply device 20 at the time of setup guidance. Specifically, as shown in FIG. 10, the usable number Mv1 of feeders 23 corresponds to the inventory number Ns calculated by subtracting the usable number Nu set in the component supply device 20 of the multiple component mounters 1 constituting the production line from the held number Nw of the feeders 23 held in the facility at which the production line is installed (Mv1=Ns=Nw−Nu).

When the operator requests that the fifth production job (job E) be added to the setup target, list editing section 72 performs editing such that the fifth production job (JobE) is added to the setup list in response to the request, because the required number (Ev5) of feeders 23 is smaller than the usable number Mv1 of feeders 23 (Mv1>Ev5). On the other hand, when the operator requests that the sixth production job (job F) be added to the setup target, list editing section 72 does not permit editing in accordance with the request because the required number (Ev6) of feeders 23 is larger than the usable number Mv1 of feeders 23 (Mv1<Ev6).

As described above, when the required number (Ev6) of feeders 23 exceeds the usable number Mv1 (Mv1<Ev6), list editing section 72 calculates the required number (Ev4, Ev5, Ev6) for each of the multiple production jobs (job D, job E, job F) requested to be added, and performs editing by adding one or multiple production jobs to the setup list in accordance with the request from the operator within a range where the required number (Ev4, Ev5, Ev6) does not exceed the usable number Mv1. That is, in the example described above, list editing section 72 performs editing by adding up to the fifth manufacturing job (job E) to the setup list such that the required number (Ev5) of feeders 23 does not exceed the usable number Mv1.

Further, in the example described above, for simplicity, inventory number Ns of feeders 23 and the number of usable feeders Mv1 are equal to each other. On the other hand, the usable number of feeders 23 may be smaller than the inventory number Ns of feeders 23. For example, as shown in FIG. 10, the usable number Mv2 of feeders 23 is calculated by subtracting, from the inventory number Ns, an amount (reservation number Nr) which is a number of feeders 23 that are reserved for performing the production jobs at other production lines when there are other production lines sharing the feeders 23 in the facility where the production lines are installed (Mv2=Ns−Nr). As described above, when a usable number Mv2 smaller than the inventory number Ns due to reserved number Nr or the like is acquired, the required number (Ev4) of the fourth production job (job D) exceeds the usable number Mv2, thus list editing section 72 allows up to the third production job (job C) to be added to the setup list corresponding to the required number (Ev3) which is equal to or less than the usable number Mv2.

The inventory number Ns of feeders 23 may include the number of feeders 23 to be collected at the time of setup guidance due to recovery guidance, which is described later. As described above, list editing section 72 edits the setup list to the extent allowed by certain restrictions, based on the required number (Ev4, Ev5, Ev6, . . . ) of feeders 23 according to a request from an operator and the usable number Mv1, Mv2 that can vary according to the time of the setup guidance.

Further, the usable number Mv1, Mv2 may be calculated by using the maximum number of feeders 23 that are usable for production jobs (that can be re-used) instead of the held number Nw as described above. The maximum number of feeders 23 is set by, for example, a production line administrator or an operator. When the number of uses of the feeders 23 used in the multiple production jobs to be added to the targets for setup requested by an operator (including the number of uses Nu set in the component supplying devices 20 of the multiple component mounters 1) exceeds the above maximum number, list editing section 72 performs editing by adding production jobs to the setup list in response to the request of the operator within a range in which the number of uses does not exceed the maximum number. Note that, when editing is performed in a range different from the request of the operator, list editing section 72 may indicate the required number (Ev4,Ev5,Ev6, . . . ) of feeders 23 corresponding to the request and the usable number Mv1 (Mv2) of feeders 23 at the time of setup guidance to the operator, and notify the operator of the content of the editing performed in the allowable range.

In addition to the above, the "certain restrictions" include a restriction based on a situation in which the setup preparation is insufficient and all the requested setup cannot be completed. Specifically, assuming a case in which feeder 23 is not loaded with a reel of an appropriate component type, or a case in which feeder 23 is loaded with a reel and an appropriate component type is associated with the feeder 23, but the feeder 23 is not loaded on preparation cart 80, which is described later. In such cases, list editing unit 72 may determine that it is impossible to issue guidance as to which feeder 23 should be finally set in which slot 21 of component supply device 20, and may issue guidance to the operator to the extent that setup can be completed.

Here, when the target production quantity according to the production plan is changed before or during production, host computer 60 changes the production schedule based on the changed production plan and product data. In such a case, list editing section 72 performs editing so as to increase or decrease the number of production jobs included in the setup list in accordance with the change of the production schedule. Specifically, for example, when production of second product type U2 is canceled, target production quantity T2 of second product type U2 is set to zero by host computer 60, and the second production job (job B) is deleted from the production schedule.

Then, list editing section 72 performs editing to delete, from the setup list, a setup that is the setup of the second production job (job B) and that does not affect other production jobs (job A, job C) belonging to the same group (Gr01), in accordance with the change in the production schedule. The setup to be deleted is, for example, a replenishment process of feeders 23 loaded with component types used only in the second production (job B).

Guidance section 73 guides an operator to perform setup of production jobs based on the initial setup list generated by host computer 60 or the setup list edited by list editing section 72. Specifically, for example, guidance section 73 guides the operator by displaying the contents of the setup on a tablet terminal (not shown) carried by the operator. In the present embodiment, guidance section 73 displays the content of the setup on display device 82 provided on the preparation cart 80. The above "setup content", in a case in which the setup is a feeder 23 replenishment process, indicates which feeders 23 (Fdx10, Fdx11, . . . ) are to be set in which slots 21 (SL01, SL02, . . . ) of component supply device 20 (refer to table 1 of FIG. 5).

Here, the setup of a production job includes a replenishment process of exchangeable elements that are set on component mounter 1 so as to be exchangeable. Specifically, exchangeable elements are taken to be, for example, feeder 23 set in component supply device 20, mounting head 33 and suction nozzle 34 mounted on a loading body, and a loading body on which multiple suction nozzles 34 are loaded. Guidance section 73 guides the replenishment of exchangeable elements based on the setup list, and guides the collection of exchangeable elements based on the setup list when the setup list is edited or when performing of a portion of the production jobs in the production schedule has been completed (refer to table 2 of FIG. 5).

Here, for each of the multiple production jobs included in the production schedule, as shown in table 3 of FIG. 4, a start condition used for determining whether to allow performing of each production job to be started is set (for example, the start condition of "job A" is "Set1" and the start condition of "job F" is "Set3"). When performing a specified production job, component mounter 1 determines whether the above start condition is satisfied, and starts the production job if the start condition is satisfied. In the present embodiment, component mounter 1 is set such that a starting condition of a production job to be performed next is that setup has been completed of a specified single or multiple production jobs among the multiple production jobs.

In detail, multiple production jobs (job A, job B, job C) grouped (Gr01) so as to be performed with one setup are set with a starting condition such that the setup (Set1) of all of the multiple production jobs grouped initially for performing these production jobs as a set must be complete. On the other hand, for an individual production job (job F) that is not grouped, the starting condition is the completion of the setup (Set3) of that production job. When guidance is issued all at once for setups (Set1, Set2) of multiple production jobs (for example, job A to job E), as shown in table 1 of FIG. 5, guidance section 73 issues guidance with information indicating whether each setup is a starting condition of a production job (job A) to be performed next along with guidance for each setup. In the "Starting condition" column of table 1 of FIG. 5, a black circle indicates that the setting of the feeder 23 to the slot 21 is a "Starting condition", and "-" indicates that the setting of the feeder 23 to the slot 21 is not a "Starting condition".

Condition editing section 74 accepts editing of the starting conditions of specified production jobs in the production schedule, and sends the edited starting conditions to component mounter 1 to update them. Thus, component mounter 1 determines whether to allow performing of the production job to be started based on the edited starting condition. Condition editing section 74 accepts editing of starting conditions of production jobs via, for example, an input device, which is not shown, or host computer 60. Here, condition editing section 74 can individually edit the starting conditions for each of the production jobs (job A, job B, job C) belonging to the group (Gr01).

That is, since initially multiple production jobs belonging to the same group (Gr01) can be performed with one setup (Set1), the setup (Set1) is set as a starting condition. However, in the same group (Gr01), for example, a production job (job A) to be performed first becomes practically able to be performed when the setup of that production job (job A) is completed. Therefore, condition editing section 74 accepts editing of multiple grouped production jobs when a starting condition is set for each of the multiple production jobs.

Figure 5:
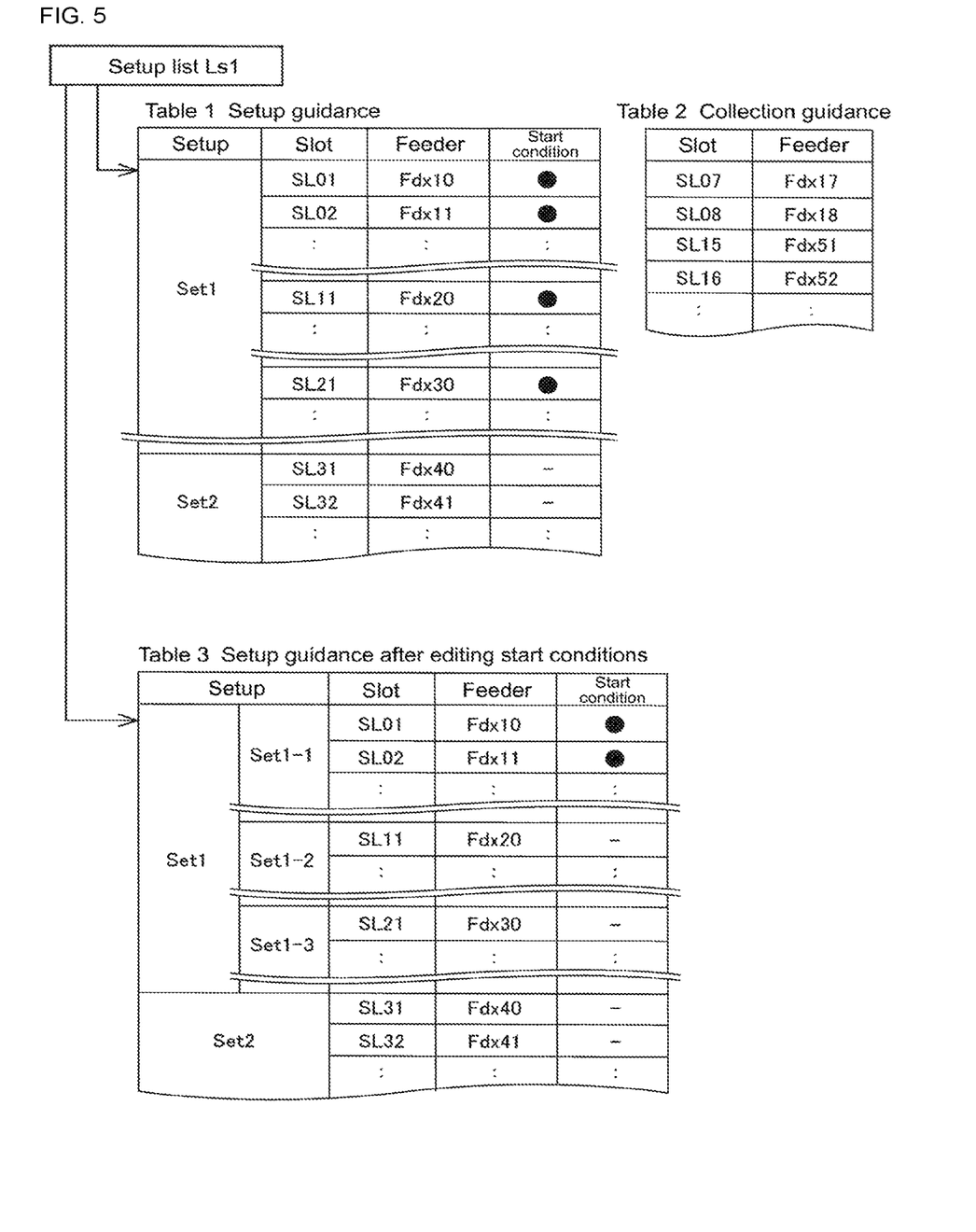
FIG. 5 shows the contents displayed by the setup guidance.
Figure 6:
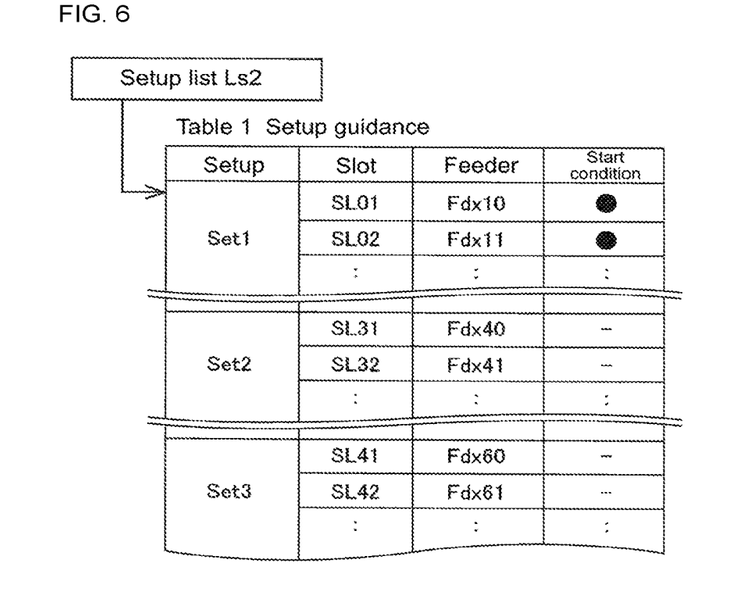
FIG. 6 shows the contents displayed by the setup guidance based on the setup list after editing the start condition.

When a starting condition of specified production jobs (for example, job A, job B, job C) is edited by condition editing section 74, as shown in table 3 of FIG. 5, guidance section 73 issues guidance with information indicating whether each setup is a starting condition of a production job (job A) to be performed next time along with guidance for the setup (Set1). Table 3 of FIG. 5 illustrates an example of the content of guidance issued by guidance section 73 when multiple production jobs (job A, job B, job C) belong to a predetermined group (Gr01) and are edited such that only a portion (Set1-1) of the setup required to perform the first production job (job A) becomes the starting condition. According to this example, production jobs (job B, job C) that differ from the first production job (job A) belong to the same group (Gr01) as the first production job (job A), but do not become a starting condition of the first production job (job A). That is, the first production job (job A) can be started prior to completion of the setups (Set1-2, Set1-3) required to perform the other production jobs (job B, job C).

As shown in FIG. 1, preparation cart 80 is configured to be movable along the production line in the conveyance direction of circuit board 90. Preparation cart 80 is loaded with the exchangeable elements that are set in component mounter 1 by the exchanging process during setup of the production jobs. In the present embodiment, multiple feeders 23 used for performing multiple production jobs are loaded on preparation cart 80 as exchangeable elements. As shown in FIG. 3, preparation cart 80 includes multiple slots 81, display device 82, and reader device 83. Multiple slots 81 are configured in a similar manner to the multiple slots 21 of component supply device 20 and are for supporting exchange-use feeders 23.

Preparation cart 80 is configured with two levels in a vertical direction of multiple slots 81 arranged in a line in the horizontal direction (not shown). Further, the exchange-use feeders 23 set in each of the multiple slots 81 are electrically connected to preparation cart 80 to be supplied with electric power and controlled externally. Display device 82 displays the contents (table 1 to table 3 in FIG. 5) of guidance issued by guidance section 73 of setup support device 70 to the operator. In the present embodiment, display device 82 is configured from a touchscreen and functions as an input device that receives various inputs from an operator.

Figure 7:
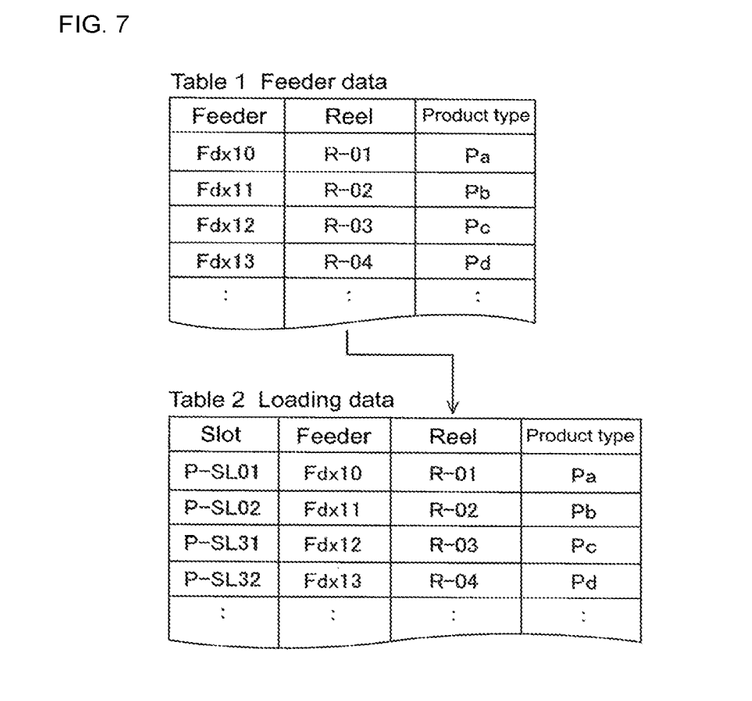
FIG. 7 shows feeder data and loading information.

Here, when reels with a specified component type are set on exchange-use feeders 23 loaded on preparation cart 80, processing for linking the feeder 23 and the component type is performed in advance. By this, feeder data (refer to table 1 of FIG. 7) that links reel IDs and component types is generated with a feeder ID that is unique identification information of the feeder 23. Feeder data is shared between host computer 60 and setup support device 70.

When the exchange-use feeder 23 is set in slot 81 of preparation cart 80, the feeder ID of the feeder 23 is read and recognized by setup support device 70. As a result, loading information (table 2 in FIG. 7) indicating the multiple exchange-use feeders 23 loaded on preparation cart 80 is generated. The above loading information links the exchange-use feeder 23 (feeder ID), the set reel (reel ID), and component type (Pa, Pb, Pc, . . . ) to the slot 81 (slot ID) of preparation cart 80. The above loading information is updated each time feeder 23 is removed and inserted into slot 81 of preparation cart 80.

Reader device 83 configures an identification device that acquires identification information of component supply device 20. Reader device 83 includes a communication device that performs wireless communication with tag 24 and that is provided at approximately the same height as tag 24 of component supply device 20 on the surface facing the front surface of component mounter 1 of preparation cart 80. This communication device is configured to be able to read the identification information of component supply device 20 by wireless communication with tag 24.

According to such a configuration, when preparation cart 80 is moved along the conveying direction of circuit board 90 at the production line and gets within a predetermined distance of component supply device 20, wireless communication is performed between tag 24 and reader device 83. As a result, setup support device 70 reads the identification code recorded in tag 24, and acquires the identification information of component supply device 20 recorded in the identification code.

Setup Guidance Processing

A description will be given of setup guidance processing for production jobs by setup support device 70 with reference to FIGS. 4 to 8. Here, it is assumed that the above setup is a replenishment process of an exchangeable element (feeder 23) that is set in component mounter 1 so as to be exchangeable. Further, it is assumed that exchange-use feeders 23 used to perform multiple production jobs (jobs A to G) of the production schedule are loaded on preparation cart 80.

The component types corresponding to the reels that are set are linked in advance to each of the exchange-use feeders 23. Host computer 60 and setup support device 70 share the feeder data (table 1 of FIG. 7) generated based on the above link and the loading information (table 2 of FIG. 7) indicating the multiple feeders 23 loaded on preparation cart 80. As shown in FIG. 4, the above production schedule is generated based on the production plan and the product data, and is stored in memory section 71 of setup support device 70. The performing order of the multiple production jobs in the production schedule is optimized in advance in host computer 60.

Also, in the present embodiment, to reduce the time required to perform multiple production jobs, mounting processing of the multiple production jobs is optimized. As a result, to reduce the movement distance of mounting head 33 during mounting processing, the component types supplied at each of the multiple slots 21 on component supply device 20 are set in advance. In other words, for feeders 23 linked to the component type of the reel set on the component feeder 23, it is set in advance to which slots 21 on component supply device 20 the feeders 23 are set.

Also, host computer 60 generates and memorizes on memory section 71 of setup support device 70 initial setup list Ls1 based on the two groups (Gr01, Gr02) selected as the targets for setup from the production schedule. As shown in table 4 of FIG. 4, multiple production jobs (jobs A to E) belonging to the two groups (Gr01, Gr02) are included in setup list Ls1. The generated setup list Ls1 is sent to setup support device 70 via the network and memorized on memory section 71.

Figure 8:
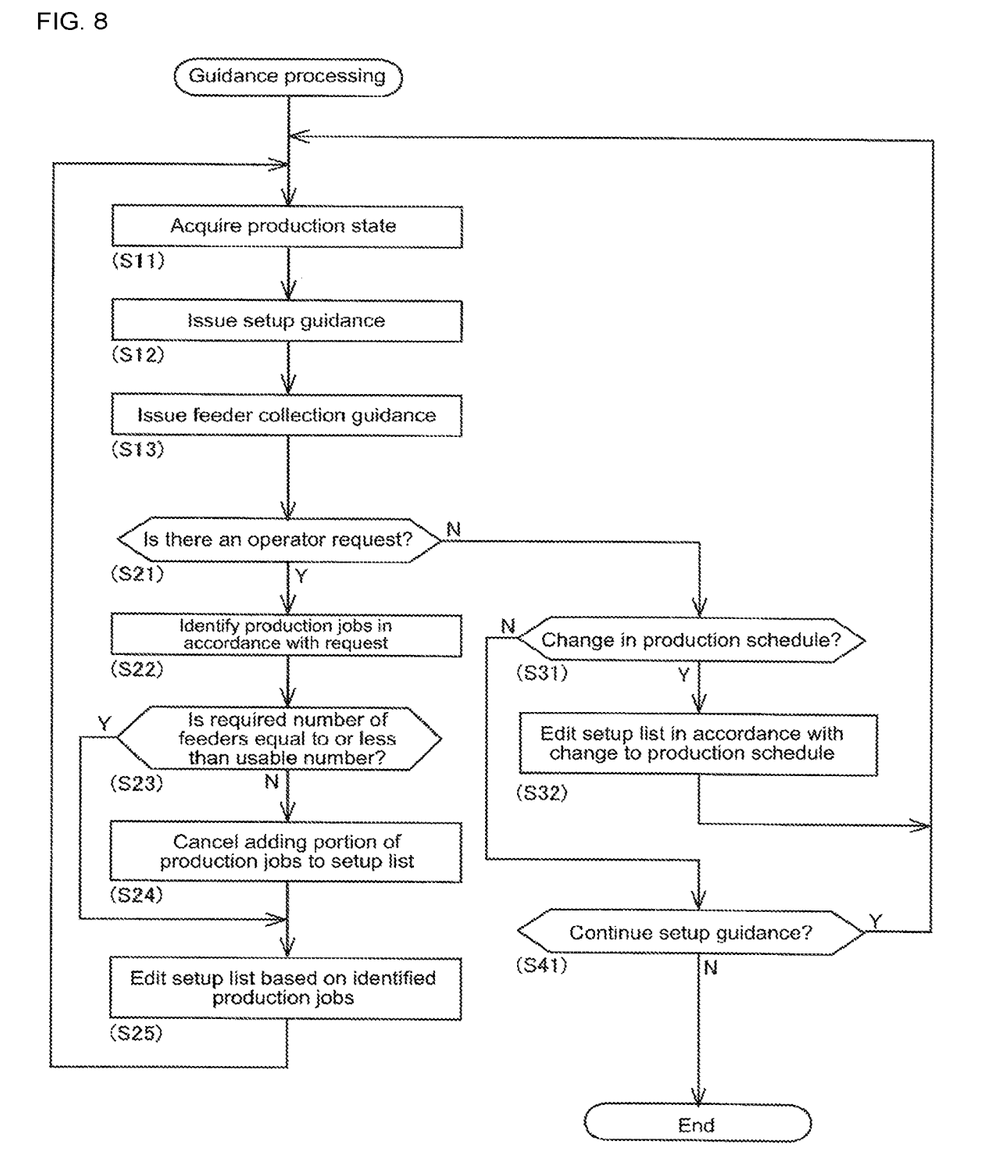
FIG. 8 is a flowchart showing setup guidance processing.

Setup support device 70, for example, when receiving a request for setup guidance from an operator via display device 82, as shown in FIG. 8, starts setup guidance processing. Here, the operator inputs to setup support device 70 for which of the multiple component mounters 1 constituting the production line setup is to be performed with respect to component supply device 20 of component mounter 1. As the input method, a method of selecting from options displayed on an input device or a method of directly inputting the identification information of component supply device 20 may be adopted.

In addition to the above, setup support device 70 may start setup guidance processing when, for example, the preparation cart 80 is moved in the conveying direction of circuit board 90 to get to a predetermined distance from component supply device 20 of a specified component mounter 1 of the multiple component mounters 1, and reader device 83 of the preparation cart 80 wirelessly communicates with tag 24 of component supply device 20 to obtain the identification information of the component supply device 20. By this, the operation of inputting the identification information of component supply device 20 can be omitted.

In setup guidance processing, setup support device 70 first acquires a production state including a degree of progress of the production schedule (Step 11 [hereinafter, "step" is referred to as "S"]). Setup support device 70 recognizes the production job currently being performed, completed production jobs, and planned production jobs from the production schedule, based on the production state. Here, setup support device 70 recognizes the first production job (job A) at the head of the production schedule as the next production job to be performed.

Next, guidance section 73 issues guidance for the setup of production jobs based on the setup list Ls1 generated as described above (S12). Specifically, as shown in table 4 of FIG. 4, when multiple production jobs (job A to job E) for two setups (Set1, Set2) are set in the initial setup list Ls1, guidance section 73 displays content on display device 82 based on the feeder data (table 1 of FIG. 7) and the loading data (table 2 of FIG. 7) such that feeders 23 required to be able to perform the multiple production jobs (job A to job E) are set in the specified slots 21 of component supply device 20 (table 1 of FIG. 5).

Here, the guidance section 73 issues guidance information indicating whether each setup is a starting condition of the production job (job A) to be performed next, together with the guidance for each setup. Here, the first production job (job A) belongs to the first group (Gr01) and is set as a starting condition for enabling other production jobs (job B, job C) belonging to the first group (Gr01) to be performed. For this reason, as shown in table 1 of FIG. 5, guidance section 73 also issues guidance that the entire first setup (Set1) is a starting condition.

Continuing, guidance section 73 issues guidance to collect feeders 23, which are exchangeable elements, based on the setup list Ls1 (S13). Specifically, setup support device 70 specifies unnecessary feeders 23 set in the multiple slots 21 in component supply device 20 when the production status acquired in S11 or the setup list Ls1 is edited as described later and a portion of the setups become unnecessary. Then, guidance section 73 issues guidance for the replenishment of exchange-use feeders 23 for replacement in S12, and issues guidance for the collection of feeders 23 specified as unnecessary, as shown in table 2 of FIG. 5. Guidance section 73 omits guidance for the collection of feeders 23 when there are no unnecessary feeders 23 or when there is no effect on the performing of subsequent production jobs even when feeders are set in a slot 21.

List editing section 72 determines whether there is an operator request to edit the displayed setup content (S21). List editing section 72, for example, identifies a production job in response to a request when an operator requests the editing of a setup list Ls1 (S21: yes) by the operator using display device 82 (S22). Here, the request of the operator may be in various forms. For example, an operator request may be made by specifying a particular production job or jobs, by specifying one or more groups to which production jobs belong, or by specifying a date and time (time) for performance according to a production schedule. Then, one or multiple production jobs specified by these jobs are requested to be added to or deleted from the targets for setup.

Here, the specifying of a date and time (time) as above, for example, is a request to make one or multiple production jobs that can be started to be performed by the specified time out of multiple production jobs included in the production schedule as targets for setup. In this case, list editing section 72 identifies one or multiple production jobs that can be started to be performed by the specified time based on the production state acquired in S11, the required time of each production job included in the production schedule, and the scheduled start date and time. Note that, list editing section 72 can accept, as the date and time, specifying a time period such as morning or today in addition to hours and minutes.

Continuing, list editing section 72 determines whether the required number of feeders 23 used in the multiple production jobs requested by the operator to be added as targets for setup exceeds the number of feeders 23 usable at the time of guidance of the setup (here, at the time of guidance is "current time") (S23). Note that, list editing section 72 regards it as a request to be added when one or multiple production jobs are specified by time specification in S22, and when there are insufficient specified production jobs in the present setup list Ls1. On the other hand, when one or multiple production jobs are specified by the time specification in S22 and there are excessive production jobs in the present setup list Ls1, list editing section 72 regards the production jobs as requests to be deleted.

When the required number of feeders 23 exceeds the usable number (S23: yes), list editing section 72 calculates the required number for each of the multiple production jobs requested to be added, and cancels the addition to the setup list Ls1 starting from production jobs that are later in the order of being performed of the multiple production jobs specified in S22 such that the required number of the feeders 23 becomes equal to or less than the usable number (S24).

This makes it possible to fulfill the request of the operator to the maximum extent, for example, while not exceeding the usable number based on the number of inventories Nw and Ns of feeders 23.

When the required number of the feeders 23 is equal to or less than the usable number (S23: no), or when production jobs to be added to the setup list Ls1 are adjusted in S24, list editing section 72 performs editing to increase or decrease production jobs included in the setup list Ls1 based on the identified production jobs (S25). Thus, when processing of S23 is performed, list editing section 72 edits the setup list Ls1 to add production jobs to the setup list Ls1 in response to the request of the operator within a range in which the required number does not exceed the usable number.

Further, according to the above processing, specifically, for example, when the operator requests setup guidance for production jobs to be performed during today (M/D1) (S21: yes), list editing section 72 first identifies the multiple production jobs (job A to job F) for which the planned start dates and times are set as during today (M/D1) (S22). Then, list editing section 72 edits the current setup list Ls1 (S25) to include setups (Set1 to Set3) corresponding to the identified production jobs (job A to job F) while adjusting the additional production jobs (S23) as needed. As a result, the initial setup list Ls1 becomes an edited setup list Ls2 including the above setups (Set1 to Set3), as shown in table 5 of FIG. 4.

When there is no request to edit the setup list (S21: no), list editing section 72 determines whether there is a change in the production schedule (S31). The production schedule can be changed by, for example, the production line manager adding a new product type to be produced at host computer 60, canceling production of a specified product type, or changing the production order. When the production schedule is changed at host computer 60, the changed production schedule is transferred to setup support device 70 via the network and stored in memory section 71.

When there is a change in the production schedule (S31: yes), list editing section 72 performs editing so as to increase or decrease the production jobs included in the setup list in accordance with the change in the production schedule (S32). For example, when the production schedule is changed so as to prioritize producing a board product of a specified product type, list editing section 72 specifies the production job corresponding to the request based on the production order, the group, the date and time specified by the operator, and the like of the production job corresponding to the product type. Then, editing is performed to add an identified production job or jobs to the setup list.

When the setup list is edited in S25 or S32, a production state is acquired again (S11), and guidance section 73 issues setup guidance based on the edited setup list (S12). Specifically, for example, when the original setup list Ls1 is edited (S25) and setup list Ls2 is obtained, guidance section 73 displays guidance contents on display device 82 based on the setup list Ls2, the feeder data (table 1 in FIG. 7), and the loading data (table 2 in FIG. 7) such that the feeders 23 required to be able to perform the multiple production jobs (job A to job F) are set in the identified slots 21 of component supply device 20 (table 1 in FIG. 6). Further, guidance section 73 also issues guidance for the collection of the feeders 23, which are exchangeable elements, depending on changes to the production state or the editing state of the setup list Ls2 (S13).

When there is no operator request and the production schedule has not been changed (S31: no), setup support device 70 determines whether to continue the setup guidance (S41). For example, when it is determined that the operator is working and the guidance of the setup is to be continued (S41: yes), setup support device 70 periodically acquires the production state again (S11) and repeats the above processing. On the other hand, when all of the feeders 23 from the preparation cart 80 for which guidance was issued are set in the slots 21 of component feeding device 20, and when all of the feeders 23 for which guidance for collection are loaded on preparation cart 80, and when preparation cart 80 has been moved, setup support device 70 determines that the setup guidance is not to be continued (S41: no), and ends setup guidance processing.

Effects of Configuration of Embodiments

Setup support device 70 is applied to component mounter 1 that performs various multiple production jobs for mounting electronic components on circuit boards 90 to produce multiple types of circuit board products. The setup support device 70 includes: memory section 71 configured to store a production schedule indicating an execution order of the production jobs as a production order of multiple types of the board products and a setup list indicating one or multiple of the production jobs selected as a setup target for enabling production of the production jobs by component mounter 1 among the multiple production jobs included in the production schedule; list editing section 72 configured to edit the setup with respect to the component mounter so as to increase or decrease the production jobs included in the setup list in response to a request from an operator who performs the setup or a change in the production schedule; and guidance section 73 configured to guide the operator to perform the setup of the production jobs based on the edited setup list.

According to such a configuration, setup support device 70 edits the setup list in accordance with a request from an operator (S21 to S25). By this, setup support device 70 can vary the setup contents in accordance with the production state and the work state recognized by the operator. Further, setup support device 70 edits the setup according to a change in the production schedule (S31, S32). As a result, the setup contents can be changed by reflecting the production schedule changed at the production management side, and unnecessary setup can be prevented. By editing the setup list as described above (S25, S32), the efficiency of setup is improved. Further, for example, a setup unnecessary for the next production job can be postponed, and a setup that should be performed can be prioritized, thereby making effective use of human resources such as operators. In addition, when there is a change in the production schedule, it is possible to cope with the change without generating the setup list again. Therefore, it is possible to prevent the production time from increasing and to prevent the operating rate of the component mounter from decreasing.

List editing section 72 edits the setup list in accordance with a request from the operator when the operator requests to add or delete a portion of production jobs included in the production schedule to or from the targets for setup. Guidance section 73 issues setup guidance based on the edited setup list.

Setup support device 70 issues setup guidance to the operator based on the setup list representing setup contents generated in advance by optimization processing or the like and the timing for performance. However, depending on the work state of the operator, it may not always be optimal to perform setup at the timing indicated in the setup list. With respect to this point, setup support device 70 allows editing to increase or decrease scheduled targets for setups (production jobs) in accordance with a request from an operator, and issues setup guidance based on the edited setup list. As a result, the working condition and the outlook of the operator are reflected, and as a result, the operating rate of the component mounter 1 is improved, such that the time required for production is shortened.

Further, list editing section 72 edits the setup list in accordance with a request from the operator when one or multiple production jobs that can be started to be performed by a specified time out of multiple production jobs included in the production schedule are requested to be targets for setup. Guidance section 73 guides the setup based on the edited setup list.

According to such a configuration, an operator or the like can request setup guidance according to the start time of a production job in consideration of the schedule and the outlook of the operator or the like. This allows the operator not only to wait for setup guidance, but also to perform the prior setups in advance, for example, when there is time to spare. This makes it possible to more effectively utilize human resources such as operators.

Setup also includes a replenishment process of an exchangeable element that is exchangeably set on component mounter 1. Guidance section 73 guides the replenishment of exchangeable elements based on the setup list, and guides the collection of exchangeable elements based on the setup list when the setup list is edited or when performing of a portion of the production jobs in the production schedule has been completed.

According to such a configuration, setup support device 70 guides the replenishment of exchangeable elements, and also guides the collection of the exchangeable elements which become unnecessary due to the editing of the setup list or the completion of production jobs. This facilitates the collection of the exchangeable elements and makes allows for preparation for maintenance or other actions of the exchangeable elements. Further, it is possible to set other exchangeable elements in a position where a collected exchange element was set.

In addition, component mounter 1 is set such that a starting condition of a production job to be performed next is that setup has been completed of a specified single or multiple production jobs among the multiple production jobs. In a case of issuing guidance all at once for setup of multiple production jobs, guidance section 73 issues guidance with information indicating whether each setup is a start condition of a production job to be performed next along with guidance for each setup.

According to such a configuration, setup support device 70, when issuing guidance for setup all at once, also indicates as to whether the next production job to be performed cannot be started unless each setup is performed. As a result, for example, the operator can satisfy the starting condition of the production job to be performed next by prioritizing performing only the setup corresponding to the start condition, for example, without editing the setup list according to a request. This makes it possible to shorten the down time (setup time) of component mounter 1 depending on the production conditions. In addition, after a setup that is a starting condition is completed, a setup that is not a starting condition is performed, such that a production job to be performed later can be performed.

Setup support device 70 is connected to component mounter 1 such that communication is possible. Setup support device 70 further includes condition editing section 74 that accepts editing of the starting conditions of specified production jobs in the production schedule, and sends the edited starting conditions to component mounter 1 to update them.

According to such a configuration, setup support device 70 allows editing of the starting condition of a specified production job after the setup list has been generated. Further, setup support device 70 transfers the edited starting condition to component mounting device 1 to update it, and thereafter issues guidance along with that starting condition. This makes it possible perform setup with respect to the initial plan in consideration of the production state and the like, and to issue setup guidance reflecting the edited starting condition.

Also included in the setup is a replenishment process of feeders 23 that are exchangeably set on component mounter 1 to supply electronic components. Guidance section 73 guides the replenishment of feeders 23 used in production jobs included in the setup.

Feeder 23 that supplies electronic components is an exchangeable element that is exchanged according to changes in component types required for production jobs, and compared to other exchangeable elements is exchanged frequently as a target for setup. Therefore, it is particularly useful to make the exchange (replenishment and collection) of feeders 23 more efficient during setup.

Further, when there is a request by an operator to add one or more production jobs to the setup target, list editing section 72 determines whether to edit the setup list in accordance with the request from the operator based on the number of feeders required for setup of the multiple production jobs after the additions and the number of usable feeders at the time of the setup guidance.

According to such a configuration, when the operator requests editing of the setup list, setup support device 70 can determine whether to edit the setup list in accordance with the request of the operator based on the required number of feeders 23 and the available number Mv1(Mv2) of feeders 23 at the time of the setup guidance. For example, if the operator requests that the targets for setup be increased excessively, it is inappropriate to issue unrealistic setup guidance for a setup for which feeders 23 are insufficient. Therefore, according to the above configuration, setup support device 70 can prevent the setup list from being inappropriately edited.

Also, when the required number of feeders 23 exceeds the usable number (S23: no), list editing section 72 calculates the required number for each of multiple production jobs requested to be added, and performs editing such that one or multiple production jobs is added to the setup list in accordance with the request of the operator in a range in which the required number does not exceed the usable number (S24, S25). Guidance section 73 issues setup guidance based on the edited setup list (S12).

According to such a configuration, when the required number of feeders 23 exceeds the usable number in the request for editing the setup list by the operator, setup support device 70 can respond to the request of the operator within a range in which the required number does not exceed the usable number. This makes it possible to guide realistic setup based on an appropriately edited setup list while preventing the setup list from being inappropriately edited.

Alternative Embodiments

Targets for Setup Guidance

In an embodiment above, contents setup guidance by setup support device 70 relates to the replenishment and collection of feeders 23 as an exchangeable element (S12, S13). On the other hand, setup support device 70 may be used for setup guidance of other exchangeable elements such as replenishment and collection of mounting head 33, suction nozzles 34, or a loading body that holds multiple of these. Further, in addition to exchangeable elements, setup support device 70 may be configured to prompt performing of calibration processing, waste removal processing, or the like necessary before performing a specified production job.

Application of Setup Support Device

In an embodiment above, each section of setup support device 70 (memory section 71, listing editing section 72, guidance section 73, and condition editing section 74) is integrated in the control device of preparation cart 80. However, a portion or the entirely of each section of setup support device 70 may be integrated into component mounter 1 or host computer 60. The same effects are achieved with such a configuration as with the configuration of the first embodiment.

REFERENCE SIGNS LIST

1: component mounter
10: board conveyance device
20: component supply device
21: slot;
23: feeder (exchangeable element);
24: tag;
30: component transfer device;
31: head driving device;
32: moving body;
33: mounting head;
34: suction nozzle
41: component camera;
42: board camera;
50: control device
60: host computer
70: setup support device
71: memory section;
72: list editing section;
73: guidance section;
74: condition editing section;
80: preparation cart;
81: slot;
82: display device
83: reader device
90: circuit board

The invention claimed is:

1. A setup support device applied to a component mounter for producing multiple types of board products by performing various multiple production jobs for mounting electronic components on a circuit board, the setup support device comprising:
   a memory configured to store a production schedule indicating an execution order of the production jobs as a production order of multiple types of the board products and a setup list indicating one or multiple of the production jobs selected as a setup target for enabling production of the production jobs by the component mounter among the multiple production jobs included in the production schedule; and
   a processor configured to:
   edit a setup with respect to the component mounter so as to increase or decrease the production jobs included in the setup list to create an edited setup list in response to a request from an operator who performs the setup or a change in the production schedule, and guide the operator to perform the setup of the production jobs based on the edited setup list, wherein the setup includes replenishment processing of an exchangeable element that is exchangeably set on the component mounter, the processor is configured to issue guidance for the replenishment of the exchangeable element based on the setup list, and in a case in which the setup list is edited, or in a case in which a portion of the production jobs of the production schedule are completed, issue guidance for collection of the exchangeable element based on the setup list, and the processor is configured to guide the operator by displaying content of the setup on a display.

2. The setup support device according to claim 1, wherein the processor is configured to:

edit the setup list in accordance with a request from the operator when the operator requests to add or delete a portion of production jobs included in the production schedule to or from the setup target, and issue setup guidance based on the edited setup list.

3. The setup support device according to claim 1, wherein the processor is configured to:

edit the setup list in accordance with a request from the operator when the operator requests that one or multiple production jobs that can be started to be performed by a specified time out of multiple production jobs included in the production schedule be targets for setup, and issue setup guidance based on the edited setup list.

4. The setup support device according to claim 1, wherein the component mounter is set such that a starting condition of a production job to be performed next is that setup has been completed of a specified single or multiple production jobs among the multiple production jobs, and the processor, in a case in which setup guidance is issued all at once for the multiple production jobs, is configured to issue guidance with information indicating whether each setup is the starting condition of the production job to be performed next along with guidance for each of the setups.

5. Set setup support device according to claim 4, wherein the setup support device is connected to the component mounter such that communication is possible, and the processor is configured to:

accept editing of starting conditions of specified production jobs in the production schedule, and send the edited starting conditions to the component mounter to update them.

6. The setup support device according to claim 1, wherein the exchangeable element includes a plurality of feeders that supply the electronic components, and the processor is configured to issue guidance for the replenishment of the feeders to be used in the production jobs included in the setup.

7. The setup support device according to claim 6, wherein when there is a request by an operator to acid one or more production jobs to the setup target, the processor is configured to determine whether to edit the setup list in accordance with the request from the operator based on a number of the feeders required for the setup of the multiple production jobs after the addition and a number of usable feeders at a time of the setup guidance.

8. The setup support device according to claim 7, wherein when the number of the feeders required for the setup exceeds the number of usable feeders, the processor is configured to calculate a required number for each of the multiple production jobs requested to be added, and perform editing such that one or multiple of the production jobs are added to the setup list in accordance with the request of the operator in a range in which the number of the feeders required for the one or multiple production jobs does not exceed the number of usable feeders, and the processor is configured to issue setup guidance based on the edited setup list.

* * * * *